United States Patent
Iizuka et al.

(10) Patent No.: US 10,424,678 B2
(45) Date of Patent: Sep. 24, 2019

(54) SOLAR CELL WITH DOUBLE GROOVE DIFFRACTION GRATING

(75) Inventors: Hideo Iizuka, Ann Arbor, MI (US);
Yasuhiko Takeda, Aichi-gun (JP);
Hisayoshi Fujikawa, Seto (JP)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 789 days.

(21) Appl. No.: 12/987,261

(22) Filed: Jan. 10, 2011

(65) Prior Publication Data

US 2012/0174980 A1    Jul. 12, 2012

(51) Int. Cl.
*H01L 31/0236*    (2006.01)
*H01G 9/20*    (2006.01)

(52) U.S. Cl.
CPC ....... *H01L 31/02366* (2013.01); *H01G 9/209* (2013.01); *H01G 9/2031* (2013.01); *H01G 9/2059* (2013.01); *Y02E 10/542* (2013.01); *Y02E 10/549* (2013.01)

(58) Field of Classification Search
USPC .......................................................... 136/259
See application file for complete search history.

(56) References Cited

U.S. PATENT DOCUMENTS

| | | |
|---|---|---|
| 4,398,056 A | 8/1983 | Sheng |
| 4,493,942 A | 1/1985 | Sheng et al. |
| 4,536,608 A | 8/1985 | Sheng et al. |
| 6,350,945 B1* | 2/2002 | Mizuno ................... 136/246 |
| 6,858,462 B2 | 2/2005 | Zaidi et al. |
| 6,936,761 B2 | 8/2005 | Pichler |
| 7,109,517 B2 | 9/2006 | Zaidi |
| 9,500,784 B2 | 11/2016 | Iizuka et al. |
| 2008/0223438 A1 | 9/2008 | Xiang et al. |
| 2009/0242019 A1* | 10/2009 | Ramamoorthy et al. ..... 136/255 |
| 2009/0255586 A1 | 10/2009 | Kim et al. |
| 2009/0266415 A1 | 10/2009 | Rothrock |
| 2009/0266418 A1 | 10/2009 | Hu et al. |
| 2010/0012170 A1 | 1/2010 | Varonides et al. |
| 2010/0126577 A1* | 5/2010 | Wu et al. ................... 136/256 |
| 2010/0229908 A1 | 9/2010 | Van Steenwyk et al. |
| 2011/0041909 A1* | 2/2011 | Okada et al. ............... 136/256 |

FOREIGN PATENT DOCUMENTS

| | | |
|---|---|---|
| JP | 2002260746 A | 9/2002 |
| JP | 2007005620 A | 1/2007 |
| JP | 2012018924 A | 1/2012 |

OTHER PUBLICATIONS

Saleem H. Zaidi, Diffraction Grating Structures in Solar Cells, IEEE 2000, pp. 395-398.

(Continued)

*Primary Examiner* — Dustin Q Dam
(74) *Attorney, Agent, or Firm* — Christopher G. Darrow; Darrow Mustafa PC

(57) ABSTRACT

Double groove diffraction gratings are used in combination with various types of photoelectrodes including dye-sensitized and organic photoelectrodes to increase absorption efficiency as well as to provide one or more of a variety of functions including transparency and reflectivity.

23 Claims, 4 Drawing Sheets

(56) References Cited

OTHER PUBLICATIONS

Yasuhiko Takedo, Monolithically series-interconnected transparent modules of dye-sensitized solar cells, Solar Energy Materials & Solar Cells 93 (2009), pp. 808-811.
Naohiko Kato, Degradation analysis of dye-sensitized solar cell module after long-term stability test under outdoor working condition, Solar Energy Materials & Solar Cells 93 (2009), pp. 893-897.
Toshiyuki Sano, Monolythically series-interconnected modules of dye-sensitized solar cells 1: Large-sized modules for practical uses, Renewable Energy 2006 Proceedings, pp. 349-352.
Christoph Winder, Low bandgap polymers for photon harvesting in bulk heterojunction solar cells, J. Mater Chem., 2004, 14, pp. 1077-1086.
Hideo Iizuka, Switching capability of double-sided grating with horizontal shift, App. Physics Letters 97, 2010, 053108.
Hideo Iizuka, Role of propagating modes in double-groove grating with +1st order diffraction angle larger than substrate-air critical angle, Optics Letters, 2010.
Pietarinen, et al., Double Groove Broadband gratings, Optics Express vol. 16, No. 18 (Sep. 1, 2009), pp. 13824-13829.
Saarinen, Asymmetric beam deflection by doubly grooved binary grating, Applied Optics vol. 33, No. 14, p. 2401-2405 [1195].

* cited by examiner

FIG. 3
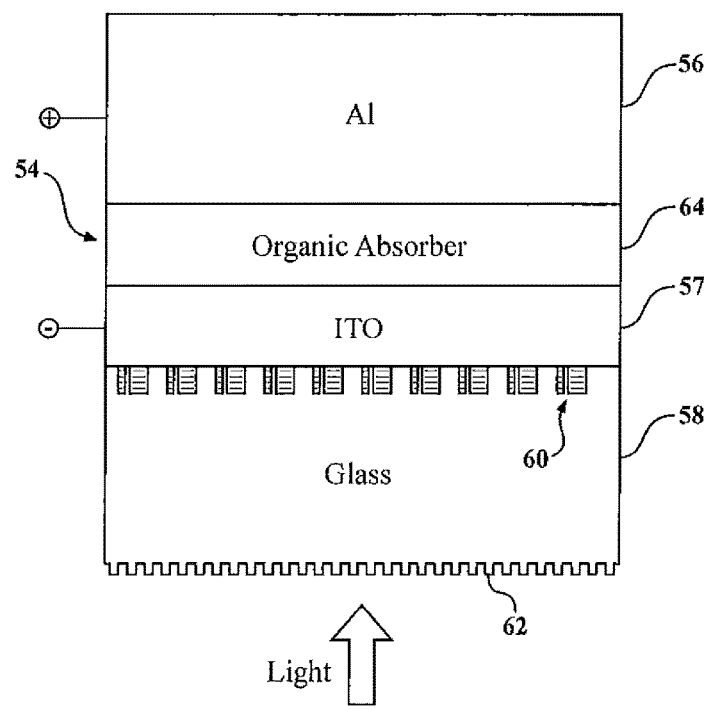
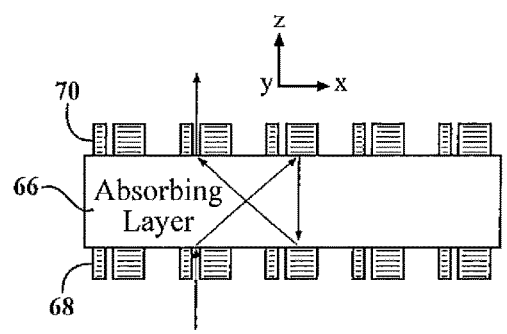
FIG. 4A
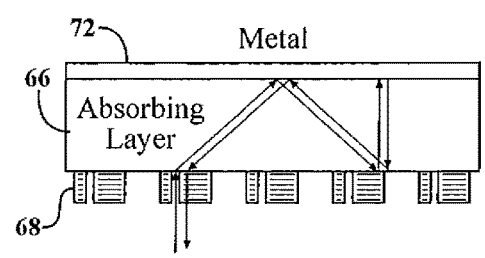
FIG. 4B

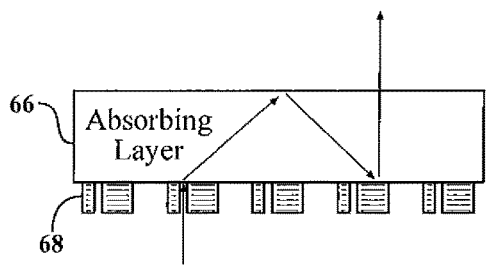
FIG. 4C
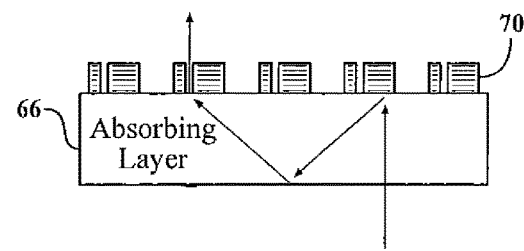
FIG. 4D
FIG. 5
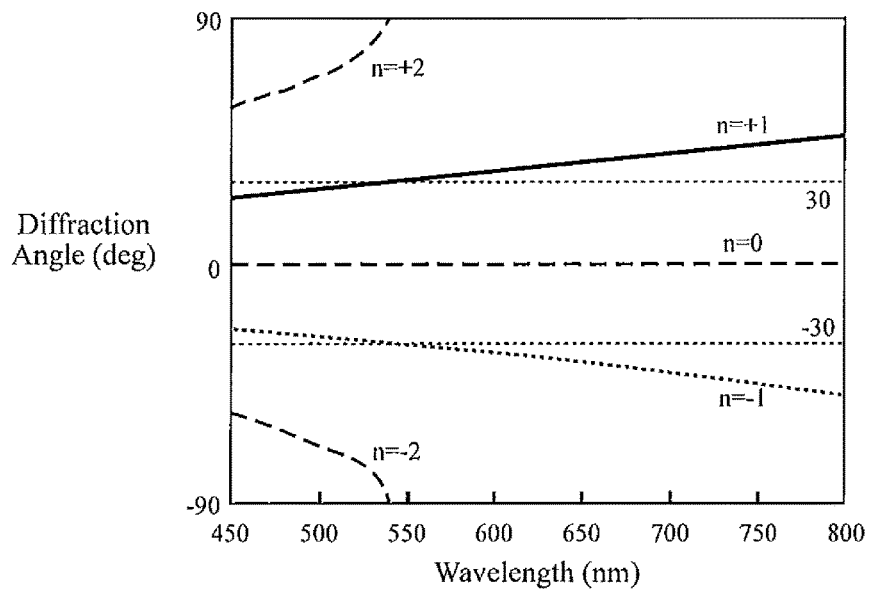

SOLAR CELL WITH DOUBLE GROOVE DIFFRACTION GRATING

FIELD OF THE INVENTION

This invention relates to solar cells and more particularly the use of double groove diffraction grating to couple a first order component of normal incident light into and/or from the light-absorbing layer.

BACKGROUND OF THE INVENTION

In our co-pending application for U.S. patent Ser. No. 12/831,587, "Solar Cell Assembly with Diffraction Gratings", filed Jul. 7, 2010, we disclosed the use of a diffraction grating in combination with dye sensitized and organic solar cells wherein the diffraction grating is structured to couple a first order diffraction component of normal incident light into an absorbing layer. In general, the combination enhances the efficiency of dye sensitized and/or organic absorbent-type solar cells.

The diffraction gratings as disclosed in our co-pending application are "single groove" diffraction gratings; i.e., gratings having a single periodicity and a regular pattern of groove width and spacing between the grooves of the diffraction grating.

SUMMARY OF THE PRESENT INVENTION

In accordance with our present invention, further enhancements in the operation of solar cells including solar cells of the dye sensitized and organic types, are realized through the use of double groove diffraction gratings; i.e., asymmetrical diffraction gratings with periodically arranged sets of adjacent grooves wherein each groove set comprises both a narrow groove and, adjacent thereto, a second groove of greater width. Both grooves are filled with $TiO_2$ or an equivalent material in a transparent substrate layer such as glass. Through this arrangement, we are able to perform a number of performance enhancing functions including the selective coupling of only first order diffraction components into the absorbing layer in such a way as to cause multiple excursions of the coupled-in light, through the absorbing layer. In the various arrangements described herein, the solar cell may be transparent or reflective and the gratings may be applied on either the front or back side of the absorbing layer or both. Where total reflectivity is desired, a front side grating is used in combination with a back side metallic layer as hereinafter described in greater detail.

BRIEF SUMMARY OF THE DRAWINGS

The description herein makes reference to the accompanying drawings wherein like reference numerals refer to like parts throughout the several views and wherein:

FIG. 3 is a side sectional view of the construction of an organic solar cell with a double groove grating on the light incident side of the absorbing layer together with an anti-reflection coating on the glass layer;

FIGS. 4A-D show various arrangements of double groove diffraction gratings with solar cell absorbing layers to perform various desirable functions;

FIG. 5 shows diffraction angles of a $TiO_2$ double groove grating at the interface of a glass and $SnO_2$:F electrode from 450 nm to 800 nm as a function of wavelength.

DETAILED DESCRIPTION OF THE ILLUSTRATIVE EMBODIMENT

Figure 1:
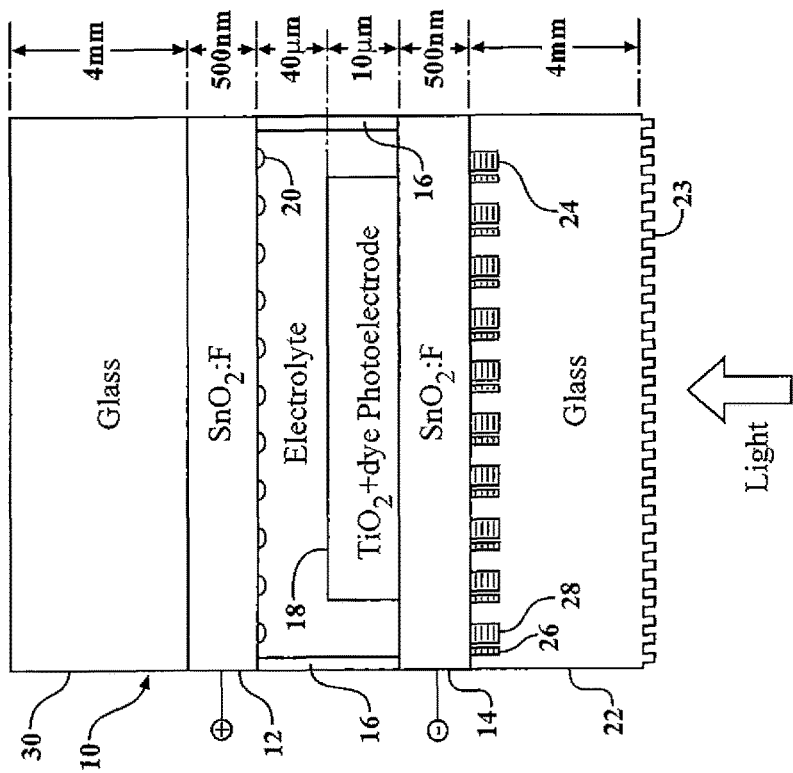
FIG. 1 is a side sectional view of a dye sensitized solar cell having a double groove grating on the front or incident light side.

Referring to FIG. 1, there is shown a dye sensitized solar cell 10 having a double groove grating 24 on the light incident side. Solar cell 10 comprises a positive electrode 12 of $SnO_2$:F and, spaced therefrom, a negative electrode 14 also constructed of $SnO_2$:F. The two electrodes 12, 14 are joined and sealed together by impervious resin walls 16 to define an interior cavity within which is disposed a dye sensitized photoelectrode 18. In this case, the dye sensitized photoelectrode is primarily $TiO_2$ but could also be ZnO. The balance of the cavity formed by the cell is filled with an electrolyte. Platinum particles 20 are bonded to the under surface of the positive electrode 12.

A glass layer 22 is formed on the light incident side of the negative electrode to receive incident light as indicated by the arrow through an anti-reflection grating 23 having a very high periodicity number; i.e., the grooves in the grating 23 are much smaller and closer together than any of the grooves in the grating 24.

The grating 24 is of the "double groove" type in that it comprises an asymmetric and periodic arrangement of groove sets wherein each set comprises regularly spaced narrow grooves 26 adjacent but spaced from wider grooves 28 having the dimensions set forth in our aforementioned co-pending application Ser. No. 12/831,587; i.e., the smaller groove width is 50 nm, the larger groove width is 170 nm, their center-to-center distance is 190 nm, the groove depth is 490 nm and the period is 540 nm. This gives rise to a diffraction angle larger than 30° when the operating wavelength is longer than 540 nm. The double groove grating 24 couples the first order component of normal incident light into the absorbing layer represented by the photoelectrode 18 with a diffraction angle greater than the critical angle of about 30° in the operating wavelength longer than 540 nm such that the first order component is reflected off of the $SnO_2$:F glass interface and back into the cell for multiple transits of the photoelectrode.

In the arrangement shown in FIG. 1, the top glass layer 30 can be replaced with a polymer film or plate and the bottom glass layer 22 can be replaced by a transparent polymer plate. Typical thickness of the glass layers 22, 30 is from 0.5 mm to 5 mm. The material in the grating grooves 26, 28 is typically $TiO_2$ but can be replaced with $Ta_2O_5$, $ZrO_2$ or $Nb_2O_5$.

Figure 2:
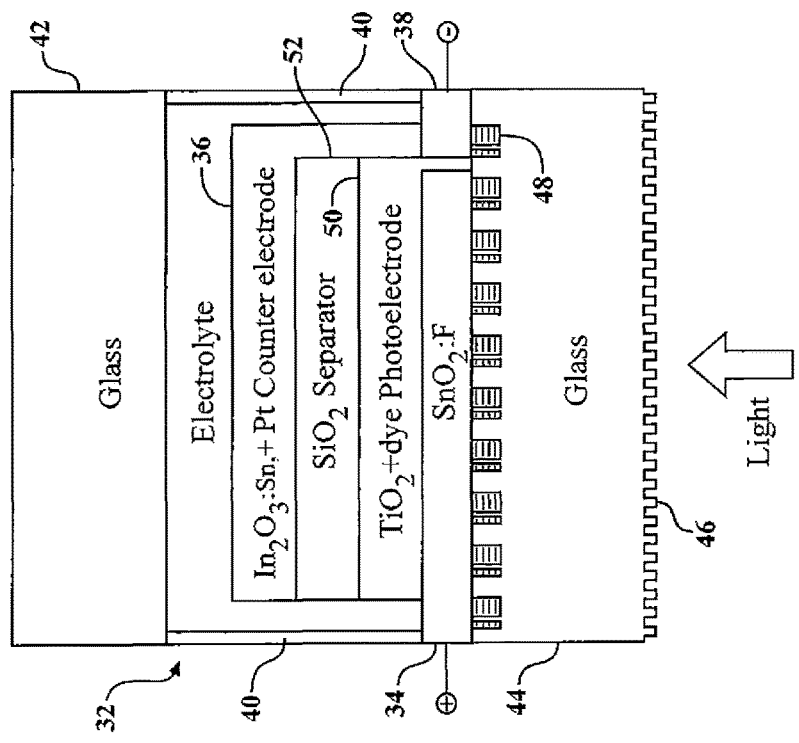
FIG. 2 is a sectional view of a second view of a dye sensitized solar cell having a different electrode arrangement.

Referring to FIG. 2, there is shown a second dye sensitized solar cell 32 comprising a positive electrode 34 of $SnO_2$:F and a negative or "counter" electrode 36 of $In_2O_3$:Sn+Pt in association with a side contact 38 for convenience in electrical serialization. The contact 38 is preferably $SnO_2$:F. Sealing resin walls complete the electrolytic chamber along with a top glass layer 42 and bottom glass layer 44 which is formed with the double groove gating 48 on the light incident side of the positive electrode 34. Again, a high periodicity anti-reflection grating 46 is optionally employed.

The absorbing layer further comprises a $TiO_2$+dye electrode 50 and a $SiO_2$ separator 52 which is placed between the dye-sensitized photoelectrode 50 and the counter electrode 36. The double groove diffraction grating 48 follows the structural specification on the grating 24 in FIG. 1 and performs essentially the same function. The material of the counter electrode 36 can also be carbon in which case the platinum content is not needed.

FIG. 3 shows solar cell 54 with an organic absorbing layer 64. The solar cell 54 comprises an electrode 56 of aluminum bonded to the top or "opposite" side of the absorbing layer 64, an indium tin oxide negative electrode 57 bonded to the light incident side of the absorbing layer 64 and a transparent glass layer 58 bonded to the incident side of the negative electrode 57 and carrying the double groove diffraction grating 60 as well as an anti-reflection grating 62 of high periodicity.

FIGS. 4A through 4D illustrate various arrangements in all of which the light-absorbing layer is represented by reference character 66. In FIG. 4A, there are asymmetric double groove diffraction gratings 68, 70 on both the light incident and opposite sides of the absorbing layer 66, it being understood that these double groove layers are embedded in a glass carrier and consist of one or the other of the materials described above. In FIG. 4A, only the first order component of normal incident light is coupled into the absorbing layer 66 at a diffraction angle greater than the critical angle. When it reaches the opposite side grating 70, it is reflected directly back through the absorbing layer 66 to the input grating 68 where it is again reflected at an angle back to the opposite side where it encounters the grating 70. Because of the order in which the narrow and wide grooves are arranged is the same on both sides, the second encounter with the opposite boundary causes the light component to exit the absorbing layer 66 creating transparency in the solar cell. In short, the absorbing layer 66 is illuminated from the bottom or input side as shown in FIG. 4A and the incident light is diffracted into oblique transmission within the absorbing layer where it is then diffracted into the normal reflection by the top grating and thereafter diffracting into the oblique reflection by the bottom grating 68 to cause the component to exit through the top grating 70 in the normal or "z" direction. The transparency of the solar cell is maintained with optical path enhancement.

In FIG. 4B, the double groove grating 68 is only located on the incident side while a metal layer 72 is deposited or otherwise bonded to the top or opposite side of the absorbing layer 66. The optical path is then doubled as shown by the arrows within the absorbing layer 66. Therefore, the absorbing layer with only one grating enjoys optical path enhancement due to reflection characteristics and a refraction angle which is larger than the critical angle.

In FIG. 4C, the diffraction grating is again on the input side and there is neither grating nor metallic layer on the opposite side of the absorbing layer 66. Accordingly, while there is optical enhancement, there is also transparency in that the normal or "z" direction component exits the absorbing layer 66 with a small lateral shift.

In FIG. 4D, the double groove layer 70 is deposited only on the opposite side of the absorbing layer 66. There is optical enhancement as shown.

FIG. 5 shows diffraction angles of the $TiO_2$ double groove grating at the interface of the glass and $SnO_2$:F electrode as a function of wavelength from 450 nm to 800 nm. The glass has a refractive index of 1.5 while the absorbing layer $SnO_2$:F electrode and electrolyte have a refractive index of approximately 2. The $TiO_2$ material in the grooves of the double groove grating has a refractive index of 2.38.

Figure 6A:
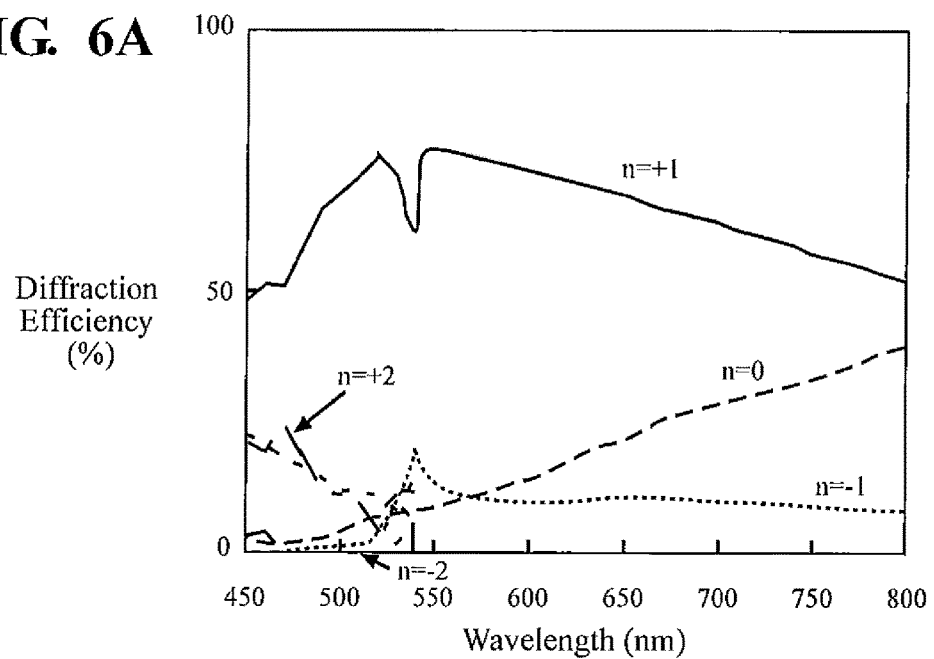
FIGS. 6A and 6B show the diffraction efficiencies for S-polarization and P-polarization, respectively.
Figure 6B:
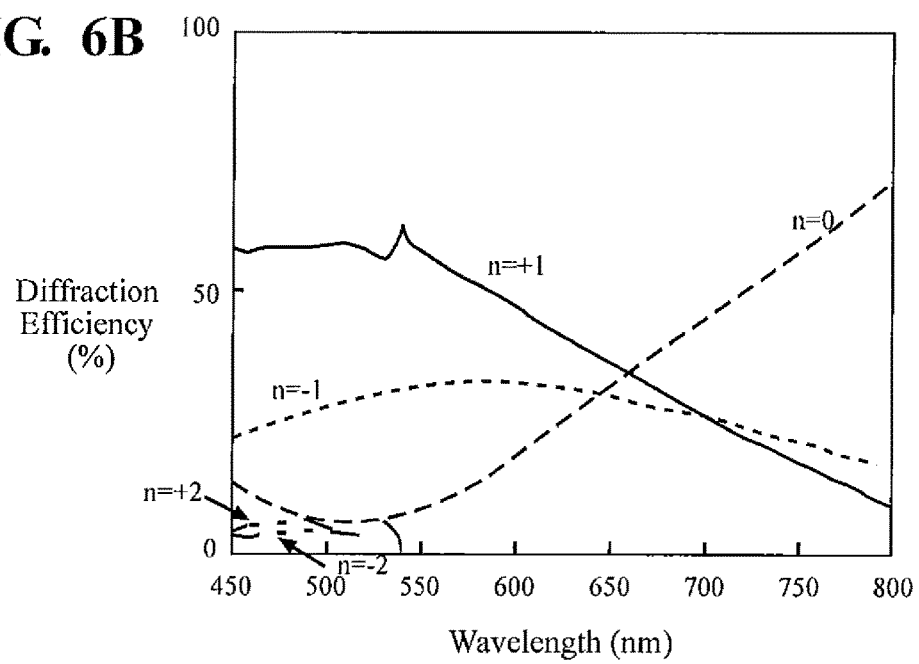

In FIGS. 6A and 6B, there are shown diffraction efficiencies for S-polarization and P-polarization respectively. S-polarized light is mainly coupled into the first order diffraction component over the entire wavelength range while P-polarized light has a major coupling of the positive first order diffraction component from 450 nm to 661 nm; it then switches to the $0^{th}$ coupling from 661 nm to 800 nm.

It will be appreciated that the embodiments illustrated in the drawing and described above are exemplary and that implementation of the invention can be carried out in various other configurations.

What is claimed is:

1. A solar cell comprising:
   a light-absorbing layer responsive to impinging polarized light to produce electrical energy;
   first and second electrodes of opposite polarity for deriving electrical energy from the light-absorbing layer; said electrodes being disposed parallel to one another on opposite sides of and generally parallel to the light-absorbing layer; and
   a solid transparent substrate having two parallel plane surfaces, one of said surfaces contactingly overlying one of the electrodes and having embedded in said contactingly overlying surface a double groove diffraction grating comprising regularly spaced double width dielectric diffraction grating elements arranged substantially along the entirety of said surface and integral with said substrate for transmissively coupling a selected first order component of normal S-polarized light incident on substantially the entirety of a surface of the light-absorbing layer into the light absorbing layer with greater than 50% coupling efficiency.

2. A solar cell as defined in claim 1 wherein the light-absorbing layer is dye sensitized.

3. A solar cell as defined in claim 1 wherein the light-absorbing layer is organic.

4. A solar cell as defined in claim 1 wherein the light-absorbing layer has parallel incident and opposite sides, said diffraction grating being located relative to the absorbing layer for coupling normal incident light into the incident side.

5. A solar cell as defined in claim 4 wherein incident light entering said incident side exits said opposite side only after at least two internal reflections.

6. A solar cell as defined in claim 4 further comprising a reflective metal layer located adjacent said opposite side.

7. A solar cell comprising:
   a light-absorbing layer having parallel incident and opposite sides;
   first and second electrodes for deriving electrical energy from the absorbing layer; and
   first and second double grooved diffraction gratings, each grating comprising a transparent substrate having two parallel surfaces with dielectric diffraction grating elements of a double groove character embedded only in a surface contacting an electrode such that light incident on the other of the substrate surfaces passes through the substrate before impinging on the grating elements, one of said double grooved diffraction gratings being oriented to transmissively couple a selected first order component of normal incident S-polarized light into the absorbing layer with greater than 50% coupling efficiency, the other of said double grooved diffraction gratings being associated with said opposite side to couple reflections of said coupled first order component out of the light-absorbing layer but only after multiple reflections through the light-absorbing layer; the double grooved diffraction gratings being arranged to direct the selected first order component of light into substantially the entirety of the incident side of said light-absorbing layer.

8. A solar cell comprising:
a first electrode;
a second electrode;
a light absorbing layer having a light incident surface;
a cell structure containing said electrodes, light absorbing layer, and an electrolyte; and
a double groove diffraction grating for transmissively coupling a selected first order component of normal incident S-polarized light into the light absorbing layer with greater than 50% coupling efficiency; said double groove diffraction grating comprising a solid transparent substrate having first and second parallel surfaces wherein the first parallel surface is a surface upon which polarized light impinges and the second surface is closest to the light absorbing layer, the double groove diffraction grating comprising a regularly arranged plurality of double width grating elements arranged along and embedded only in said second surface.

9. A solar cell as defined in claim 8 wherein the light absorbing layer is dye sensitized.

10. A solar cell comprising:
an organic light absorbing layer having first and second parallel opposite sides;
an optically transparent electrode operable to transmit diffracted light and bonded to one of said opposite sides;
an optically reflective electrode operable to reflect diffracted light and bonded to the opposite side; and
a glass layer having two parallel plane surfaces, one of said surfaces contactingly overlying the optically transparent electrode and having a double groove diffraction grating embedded in said contactingly overlying surface for transmissively coupling, with greater than 50% coupling efficiency, a first order component of normal incident S-polarized light through the optically transparent electrode into the light absorbing layer whereby the first order component of incident light transits the organic light absorbing layer multiple times due to internal reflection;
wherein the solar cell is an organic solar cell.

11. A solar cell as defined in claim 1 wherein the double groove diffraction grating is configured to transmissively couple polarized normal incident light having a wavelength, λ, within a range of 540 nm through 800 nm into a $1^{st}$-order diffraction component at an angle greater than a critical angle for internal reflection.

12. A solar cell as defined in claim 7 wherein the first diffraction grating predominantly couples a positive first order component of normal incident light into the absorbent layer at an angle greater than a critical angle for internal reflection.

13. A solar cell as defined in claim 8 wherein the diffraction grating predominantly couples a positive first order component of normal incident light into the light absorbing layer at an angle greater than a critical angle for internal reflection.

14. A solar cell as defined in claim 10 wherein the diffraction grating predominantly couples a positive first order component of normal incident light into the organic light absorbing layer at an angle greater than a critical angle for internal reflection.

15. The solar cell as defined in claim 1 wherein the double groove diffraction grating comprises a series of wide grooves alternating with narrow grooves and is characterized by a width of each wide groove, $W_1$, a width of each narrow groove, $W_2$, a center-to-center distance, $D_1$, between a wide groove and its nearest narrow groove, a groove depth, $D_2$, and a period, P; and wherein $W_1$ is 170 nm, $W_2$ is 50 nm, $D_1$ is 190 nm, $D_2$ is 490 nm, and P is 540 nm.

16. The solar cell as defined in claim 7 wherein each of the first and second double grooved diffraction gratings comprises a series of wide grooves alternating with narrow grooves and is characterized by a width of each wide groove, $W_1$, a width of each narrow groove, $W_2$, a center-to-center distance, $D_1$, between a wide groove and its nearest narrow groove, a groove depth, $D_2$, and a period, P; and wherein $W_1$ is 170 nm, $W_2$ is 50 nm, $D_1$ is 190 nm, $D_2$ is 490 nm, and P is 540 nm.

17. The solar cell as defined in claim 7 wherein the first and second double grooved diffraction gratings are disposed as mirror images of one another.

18. The solar cell as defined in claim 8 wherein the double groove diffraction grating comprises a series of wide grooves alternating with narrow grooves and is characterized by a width of each wide groove, $W_1$, a width of each narrow groove, $W_2$, a center-to-center distance, $D_1$, between a wide groove and its nearest narrow groove, a groove depth, $D_2$, and a period, P; and wherein $W_1$ is 170 nm, $W_2$ is 50 nm, $D_1$ is 190 nm, $D_2$ is 490 nm, and P is 540 nm.

19. The solar cell as defined in claim 10 wherein the double groove diffraction grating comprises a series of wide grooves alternating with narrow grooves and is characterized by a width of each wide groove, $W_1$, a width of each narrow groove, $W_2$, a center-to-center distance, $D_1$, between a wide groove and its nearest narrow groove, a groove depth, $D_2$, and a period, P; and wherein $W_1$ is 170 nm, $W_2$ is 50 nm, $D_1$ is 190 nm, $D_2$ is 490 nm, and P is 540 nm.

20. A solar cell comprising:
a photovoltaically active subassembly having a first planar photovoltaic surface and a second planar photovoltaic surface, the first and second planar photovoltaic surfaces opposite and parallel to one another, the photovoltaically active subassembly further including:
a light-absorbing layer operable to absorb a spectral component of light characterized by a wavelength λ, said spectral component of light propagated from a light source, the light-absorbing layer further operable to produce an electronic excitation in response to absorption of the spectral component of light;
a first electrode of a first polarity and composed of a first electrode material; the first electrode forming at least a portion of the planar photovoltaic surface and contacting the light absorbing layer; wherein the first electrode material is characterized by substantial transparency toward the spectral component of light and by an index of refraction, $n_{electrode}$, with respect to the spectral component of light; and
a second electrode of a second polarity in electrical communication with the light absorbing layer via an electrolyte;
a first substrate composed of a first substrate material, the first substrate having a first substrate surface in parallel contact with the portion of the first photovoltaic surface; wherein the substrate material is characterized by substantial transparency toward the spectral component of light and by an index of refraction, $n_{substrate}$, with respect to the spectral component of light; and
a second substrate having a second substrate surface in parallel contact with the second photovoltaic surface;

wherein at least one of the first substrate surface and the second substrate surface comprises a double groove diffraction grating and the second substrate is composed of the substrate material if the second substrate surface comprises a double groove diffraction grating; the double groove diffraction grating comprising:

a plurality of regularly alternating wide and narrow grooves formed in the planar surface of the substrate such that each wide groove has a nearer adjacent narrow groove and a farther adjacent narrow groove; and a plurality of grating elements, each grating element of the plurality of grating elements composed of a grating material and filling a wide or narrow groove of the plurality of regularly alternating wide and narrow grooves; wherein the grating material is characterized by substantial transparency toward the spectral component of light and by an index of refraction, $n_{grating}$, with respect to the spectral component of light;

wherein the double groove diffraction grating is configured to transmissively diffract the spectral component of light into a selected 1$^{st}$-order diffraction component with greater than 50% coupling efficiency and a diffraction angle, θ, when the spectral component of light propagates through the substrate material to the double groove diffraction grating at an angle normal to the double groove diffraction grating; wherein the double groove diffraction grating is configured to predominantly transmissively diffract the spectral component of light along a propagation vector normal to the double groove diffraction grating when the spectral component of light propagates through the photovoltaic subassembly to the double groove diffraction grating at the angle θ; wherein the double groove diffraction grating is configured to predominantly reflectively diffract the spectral component of light into a diffraction component with a diffraction angle, −θ, when the spectral component of light propagates through the photovoltaic subassembly to the double groove diffraction grating along a propagation vector normal to the double groove diffraction grating; and wherein the double groove diffraction grating is configured to predominantly reflectively diffract the spectral component of light into a diffraction component along a propagation vector normal to the double groove diffraction grating when the spectral component of light propagates through the photovoltaic subassembly to the double groove diffraction grating at the angle, −θ; and wherein λ is within a range of 540 nm through 800 nm.

21. The solar cell of claim 20 wherein the indices of refraction of the first electrode material, the substrate material, and the grating material are characterized by a relationship, $n_{substrate} < n_{electrode} < n_{grating}$.

22. The solar cell of claim 20 wherein the first substrate surface comprises the double groove diffraction grating; wherein the second substrate is composed of the substrate material; and wherein the second substrate surface comprises a second double groove diffraction grating, the second double groove diffraction grating comprising:

a second plurality of regularly alternating wide and narrow grooves formed in the planar surface of the substrate such that each wide groove has a nearer adjacent narrow groove and a farther adjacent narrow groove; wherein the substrate material is characterized by substantial transparency toward the spectral component of light and by an index of refraction, $n_{substrate}$, with respect to the spectral component of light; and a second plurality of grating elements, each grating element of the second plurality of grating elements composed of a grating material and filling a wide or narrow groove of the second plurality of regularly alternating wide and narrow grooves; wherein the grating material is characterized by substantial transparency toward the spectral component of light and by an index of refraction, $n_{grating}$, with respect to the spectral component of light;

wherein the second double groove diffraction grating is configured to transmissively diffract the spectral component of light into another selected 1$^{st}$-order diffraction component with greater than 50% coupling efficiency and a diffraction angle, −θ, when the spectral component of light propagates through the substrate material to the double groove diffraction grating at an angle normal to the double groove diffraction grating; wherein the double groove diffraction grating is configured to predominantly transmissively diffract the spectral component of light along a propagation vector normal to the double groove diffraction grating when the spectral component of light propagates through the photovoltaic subassembly to the double groove diffraction grating at the angle −θ; wherein the double groove diffraction grating is configured to predominantly reflectively diffract the spectral component of light into a diffraction component with a diffraction angle, θ, when the spectral component of light propagates through the photovoltaic subassembly to the double groove diffraction grating along a propagation vector normal to the double groove diffraction grating; and wherein the double groove diffraction grating is configured to predominantly reflectively diffract the spectral component of light into a diffraction component along a propagation vector normal to the double groove diffraction grating when the spectral component of light propagates through the photovoltaic subassembly to the double groove diffraction grating at the angle, θ.

23. The solar cell of claim 20 wherein the double groove diffraction grating is characterized by a width of each wide groove, $W_1$, a width of each narrow groove, $W_2$, a center-to-center distance, $D_1$, between a wide groove and its nearest narrow groove, a groove depth, $D_2$, and a period, P; and wherein $W_1$ is 170 nm, $W_2$ is 50 nm, $D_1$ is 190 nm, $D_2$ is 490 nm, and P is 540 nm.

* * * * *